(12) United States Patent
Akamatsu

(10) Patent No.: US 7,178,092 B2
(45) Date of Patent: Feb. 13, 2007

(54) METHOD AND APPARATUS FOR TURBO CODING AND DECODING IN READ AND WRITE CHANNEL OF DISK DRIVE

(75) Inventor: Manabu Akamatsu, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 611 days.

(21) Appl. No.: 10/341,399

(22) Filed: Jan. 14, 2003

(65) Prior Publication Data

US 2003/0161062 A1 Aug. 28, 2003

(30) Foreign Application Priority Data

Feb. 26, 2002 (JP) .............................. 2002-050019

(51) Int. Cl.
*H03M 13/03* (2006.01)
*H03M 13/00* (2006.01)

(52) U.S. Cl. ....................... 714/790; 714/769; 714/770

(58) Field of Classification Search ................ 714/790, 714/769, 770
See application file for complete search history.

(56) References Cited

U.S. PATENT DOCUMENTS

| 4,922,437 | A | | 5/1990 | Sakata et al. |
|---|---|---|---|---|
| 5,243,471 | A | | 9/1993 | Shinn |
| 5,341,249 | A | | 8/1994 | Abbott et al. |
| 5,734,962 | A | * | 3/1998 | Hladik et al. ............... 455/12.1 |
| 6,014,411 | A | | 1/2000 | Wang |
| 6,018,304 | A | * | 1/2000 | Bessios ........................ 341/58 |
| 6,023,386 | A | | 2/2000 | Reed et al. |
| 6,023,783 | A | | 2/2000 | Divsalar et al. |
| 6,108,388 | A | | 8/2000 | Douillard et al. |
| 6,249,398 | B1 | | 6/2001 | Fisher et al. |
| 6,304,985 | B1 | | 10/2001 | Sindhushayana et al. |
| 6,334,197 | B1 | | 12/2001 | Eroz et al. |
| 6,604,220 | B1 | * | 8/2003 | Lee ............................ 714/769 |
| 6,687,205 | B1 | * | 2/2004 | Huber ...................... 369/47.19 |
| 2003/0174426 | A1 | | 9/2003 | Akamatsu |
| 2004/0076245 | A1 | | 4/2004 | Okamoto et al. |

FOREIGN PATENT DOCUMENTS

| CN | 1289119 A | 3/2001 |
|---|---|---|
| CN | 1323463 A | 11/2001 |
| JP | 10-255402 | 9/1998 |
| JP | 2001-211411 | 8/2001 |

(Continued)

OTHER PUBLICATIONS

Turbo Codes 2000, VOCAL Technologies Ltd.-http://www.vocal.com, ITU—Telecommunication Standardization Sector, Jan. 8-12, 2001, pp. 1-20, hereafter referred to as the ITU Turbo Codes 2000 document.*

(Continued)

*Primary Examiner*—Joseph D. Torres
(74) *Attorney, Agent, or Firm*—Pillsbury Winthrop Shaw Pittman, LLP

(57) ABSTRACT

A disk drive is disclosed which has a read/write channel utilizing a turbo coding/decoding method. In decimating a parity sequence of an RSC code sequence, a puncture unit included in a turbo codec executes a decimation process based on a coding rate (puncture rate) determined in view of a dominant error event.

4 Claims, 4 Drawing Sheets

FOREIGN PATENT DOCUMENTS

| JP | 2001-344903 | 12/2001 |
|----|-------------|---------|
| JP | 3318937     | 6/2002  |
| JP | 2002-198827 | 7/2002  |

OTHER PUBLICATIONS

Japanese Office Action dated Mar. 8, 2005 Appln. No. 2002-050019.

Yoshihiro Okamoto et al., "Performance Evaluation of Serially Concatenated Turbo Coding in Perpendicular Magnetic Recording", Technical Report of Video Information Media Society, Video Information Media Society, Dec. 14, 2000, vol. 24, Issue No. 76, pp. 1-6.

Wu, Zining, "Coding and Iterative Detection for Magnectic Recording Channels," The Kluwer International Series in Engineering and Computer Science, Kluwer Academic Publishers, 2000, pp. 21-46.

Chinese Office Action dated Aug. 26, 2005 for Appln. No. 03103550.7.

Hagenauer et al., "A Viterbi Algorithm with Soft-Decision Outputs and its Applications," German Aerospace Research Establishment, Institute for Communications Technology, 1989, pp. 1680-1686.

Yeo et al., "VLSI Architectures for Iterative Decoders in Magnetic Recording Channels," IEEE Transactions of Magnetics, vol. 37, No. 2, Mar. 2001, pp. 748-755.

Isaka et al., "A tutorial on "parallel concatenated (Turbo) coding." "Turbo (iterative) decoding" and related topics," The Institute of Electronics, Technical Report of IEICE, 1998, pp. 1-18.

* cited by examiner

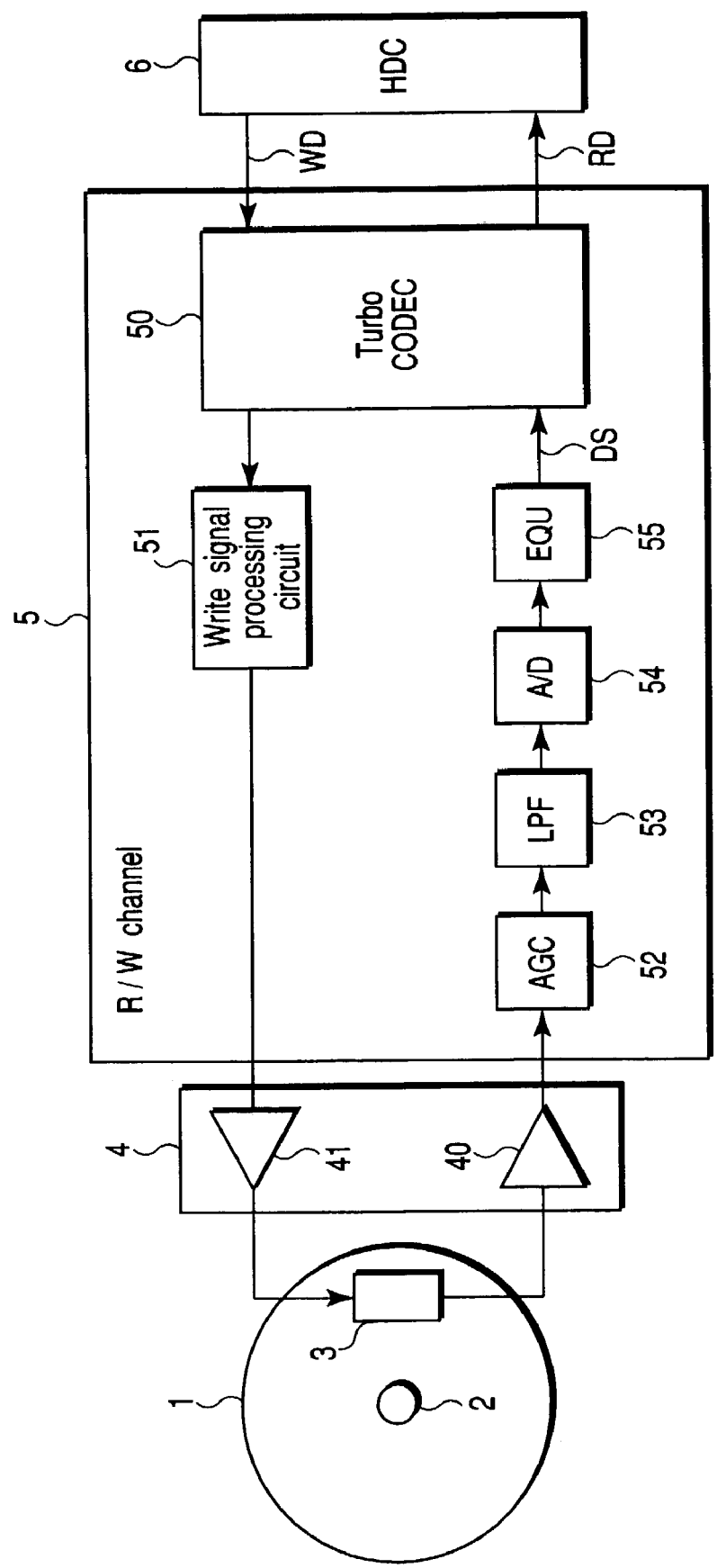
F I G. 1

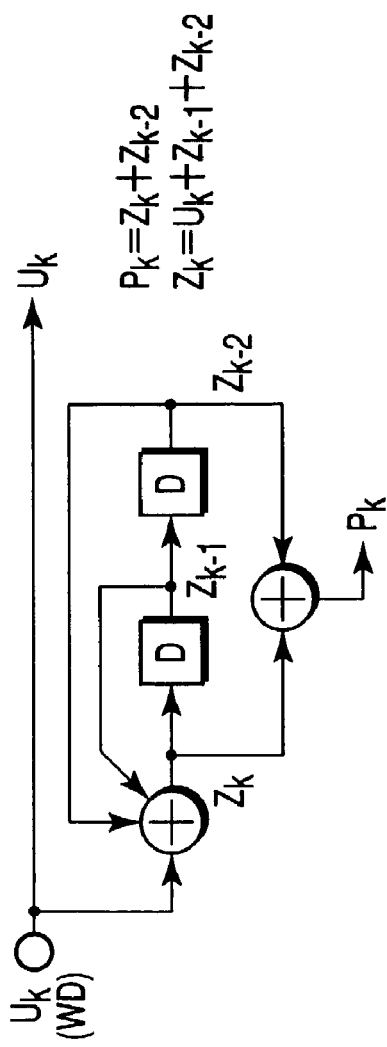

METHOD AND APPARATUS FOR TURBO CODING AND DECODING IN READ AND WRITE CHANNEL OF DISK DRIVE

CROSS-REFERENCE TO RELATED APPLICATIONS

This application is based upon and claims the benefit of priority from the prior Japanese Patent Application No. 2002-050019, filed Feb. 26, 2002, the entire contents of which are incorporated herein by reference.

BACKGROUND OF THE INVENTION

1. Field of the Invention

The present invention relates to the field of data recording and reproduction of a disk drive, and in particular, to a data recording and reproducing technique to which a turbo coding/decoding method is applied.

2. Description of the Related Art

In general, a disk drive, represented by a hard disk drive, is provided with a signal processing circuit (hereinafter referred to as a "read/write channel") to process a read signal (reproduced data signal) read by a head from a disk as a recording medium or a write signal (record data signal) written to the disk.

The read/write channel employs a so-called PRML (Partial Response Maximum Likelihood) method, a combination of a partial response (PR) method and a Viterbi decoding method.

In recent years, much attention has been paid to a turbo coding/decoding method, which is expected to provide better characteristics than the PRML method. Prior art documents on this method include, for example, "CODING AND ITERATIVE DETECTION FOR MAGNETIC RECORDING CHANNELS", (Zinning Wu, Kluwer Academic Publishers).

Specifically, a serial concatenated turbo coding and iterative decoding method has been proposed for the read/write channel of the disk drive. This method uses a recursive systematic convolutional (RSC) code to generate a systematic code sequence consisting of an information sequence and a parity sequence. The information sequence corresponds to a recorded data sequence (input information sequence) used for the disk drive. Further, the parity sequence corresponds to an error correction sequence (check bit sequence).

On the other hand, for a decoding system, an APP decoder is used which executes a posteriori probability (APP) decoding based on a soft-output Viterbi algorithm that achieves soft output decoding on the basis of the Viterbi algorithm.

When the concatenated turbo coding/decoding method is applied to the read/write channel, an RSC encoder is used to generate a systematic code sequence consisting of an information sequence and a parity sequence. This systematic code sequence has a coding rate of ½, so that if it is directly written to the disk, processing efficiency may decrease. Thus, the capability of correcting errors may be relatively degraded. However, to increase the coding rate, a decimation process called "puncture" is normally executed on the parity sequence.

However, with the concatenated turbo coding/decoding method, improvement of the error correction capability based on iterative decoding may fail under certain combinations of puncture method and RSC sequence as an outer code. This may result in a failure to obtain a good error rate characteristic (bit error rate characteristic).

BRIEF SUMMARY OF THE INVENTION

In accordance with one embodiment of the present invention, there is provided a disk drive comprising a read/write channel to which a concatenated turbo coding and iterative decoding method is applied, wherein the read/write channel has a puncture function suitable for concatenated coding.

The disk drive comprises:

a head to read and write data from and to a disk medium; and a read/write channel that operates as a signal processing unit and processes a record data signal or a reproduction data signal transmitted to and from the head, the read/write channel having a concatenated turbo codec, and wherein the concatenated turbo codec includes an RSC encoder which encodes a recorded data sequence into a recursive systematic code sequence for data recording and a puncture unit which executes a decimation process on the recursive systematic code sequence at such a decimation rate that a predetermined error rate is ensured in a decoding system.

Additional embodiments and advantages of the invention will be set forth in the description which follows, and in part will be obvious from the description, or may be learned by practice of the invention. The embodiments and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

FIG. 1 is a block diagram showing an essential part of a disk drive according to an embodiment of the present invention;

FIG. 3 is a block diagram showing an example of an RSC encoder according to this embodiment;

FIG. 4 is a diagram useful in describing an operation of a PUMUX according to this embodiment;

FIG. 5 is a diagram useful in describing an example of an error event that can be corrected by an APP decoder according to this embodiment;

FIG. 6 is a diagram useful in describing the error correction capability of a concatenated turbo codec according to this embodiment; and FIG. 7 is a diagram useful in describing an operation of a PUMUX according to a variation of this embodiment.

DETAILED DESCRIPTION OF THE INVENTION

Figure 2A:
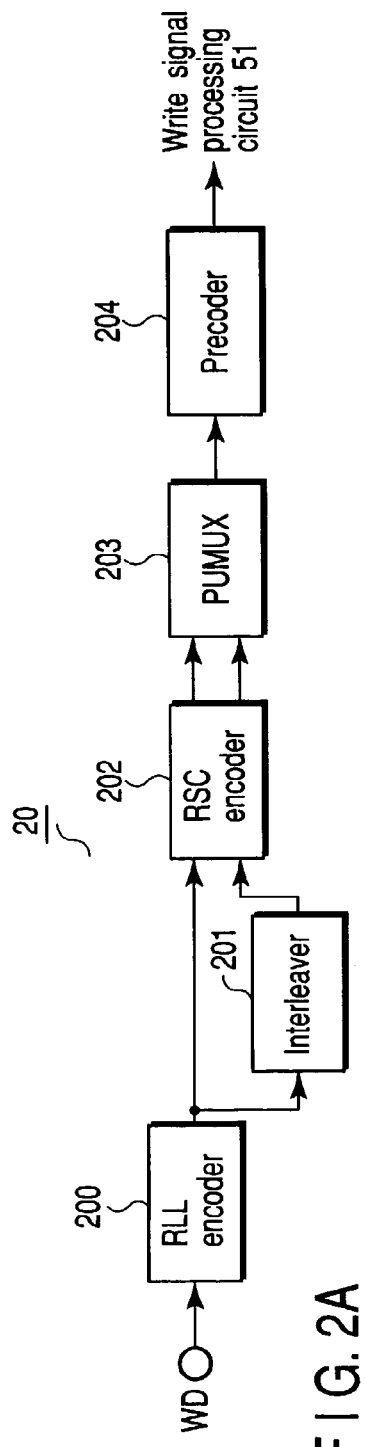
FIGS. 2A and 2B are block diagrams showing an essential part of a turbo codec according to this embodiment.

An embodiment of the present invention will be described with reference to the drawings.

(Configuration of Disk Drive)

FIG. 1 is a block diagram showing an essential part of a disk drive according to this embodiment.

This disk drive has a disk 1 as a data recording medium, a preamplifier circuit 4, a read/write channel 5, and a disk controller (HDC) 6.

The disk 1 is rotated by a spindle motor (SPM) 2. The head 3 includes a read head and a write head and uses the read head to read data from the disk 1. The head 3 also uses the write head to write data to the disk 1. The preamplifier circuit 4 has a read amplifier 40 that amplifies a read signal (reproduced data signal) from the read head and then sends it to the read/write channel 5. Further, the preamplifier circuit 4 has a write amplifier 41 that converts a write signal (recorded data signal) output by the read/write channel 5, into a write current and then supplies it to the write head.

The read/write channel 5 includes an encoder/decoder (sometimes referred to as a "turbo codec") to which a turbo coding/decoding method is applied. The write channel is composed of a turbo encoder and a write signal processing circuit 51. The write signal processing circuit 51 includes a recording compensation (precompensation) circuit.

The read channel has a turbo decoder, an AGC circuit 52, a low pass filter (LPF) 53, an A/D converter 54, and an equalizer 55.

The AGC circuit 52 controls the amplitude of a read signal from the read amplifier 40 to a fixed value. The LPF 53 removes high-frequency noise from the read signal. The A/D converter 54 converts the analog read signal into a digital signal. The equalizer 55 normally includes an FIR (Finite Impulse Response) type digital filter to execute a waveform equalization process.

In this case, the read/write channel 5 is a PR channel in which its part starting with an input of the write amplifier 41 and ending with an output of the equalizer 55 exhibits a desired PR (Partial Response) characteristic during digital magnetic recording and reproduction. This part is considered to be a kind of convolution code and corresponds to an inner code for concatenated turbo coding.

(Configuration of Turbo Codec)

Figure 2B:
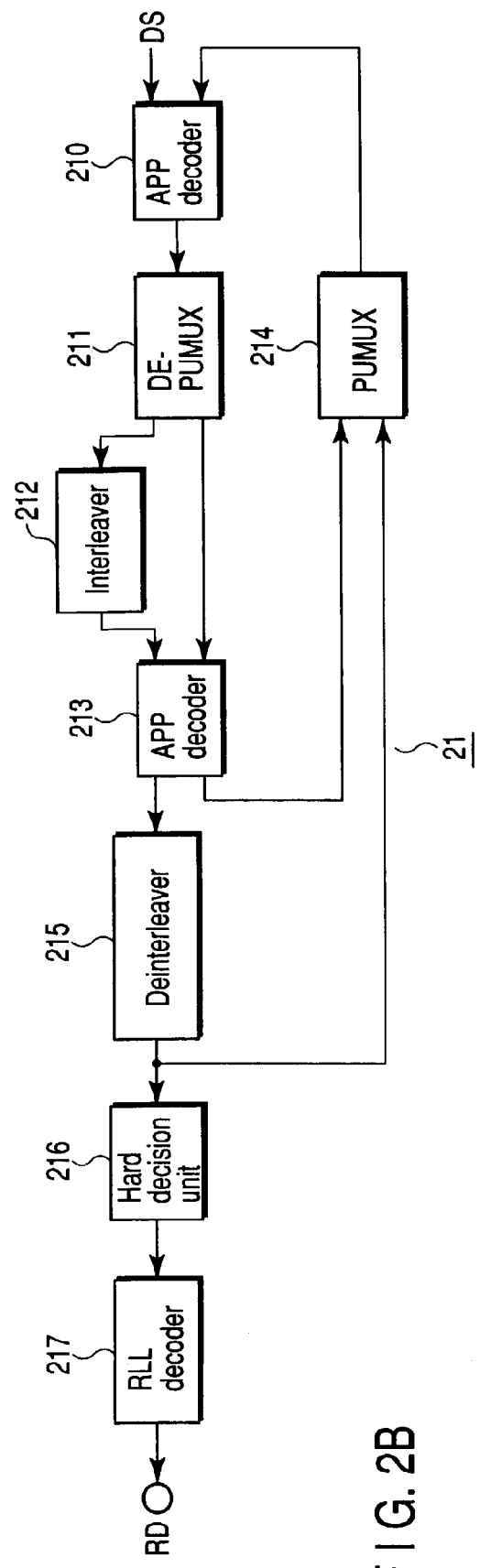

The turbo codec 50 is composed of a turbo encoder 20, shown in FIG. 2A, and a turbo decoder 21, shown in FIG. 2B. The turbo encoder 20 has an RLL (Run Length Limited) encoder 200, an interleaver 201, an RSC (Recursive Systematic Convolutional) code encoder 202, a PUMUX 203, and a precoder 204.

The RLL encoder 200 converts recorded data WD into an RLL code sequence. The interleaver 201 executes a process of disturbing (randomizing) the RLL code sequence. The RSC encoder 202 executes a recursive systematic coding process as an outer code on the RLL code sequence.

The PUMUX 203 is a combination of puncture and multiplex circuits. The PUMUX 203 multiplexes an information sequence and a parity sequence together to output the resulting systematic code sequence. The precoder 204 is installed to provide the PR channel with a recursive characteristic.

On the other hand, the turbo decoder 21 has an APP decoder 210 that executes an APP (A Posteriori Probability) decoding process on the PR channel (inner code), a DE-PUMUX 211, an interleaver 212, an APP decoder 213 that executes an APP decoding process on an RSC sequence (outer code), a PUMUX 214 used to execute an iterative decoding process, and a deinterleaver 215.

The DE-PUMUX 211 is a circuit composed of a combination of a depuncture circuit and a demultiplexer to execute a conversion process inverse to the one executed by the PUMUX 203. Further, the deinterleaver 215 executes a conversion process inverse to the one executed by the interleaver 212.

Furthermore, the turbo decoder 21 includes a hard decision unit 216 and an RLL decoder 217. The hard decision unit 216 makes a binary decision using a log likelihood ratio output by the APP decoder 213, as a threshold value to determine a final turbo decoding sequence. The RLL decoder 217 executes an RLL decoding process on a turbo decoding sequence to output a reproduced data sequence (RD) corresponding to the original data. Then, the APP decoder 213 outputs external information on the outer code excluding an LLR, to the PUMUX 214.

(Operation of Turbo Codec)

An operation of the turbo codec 50 will be described below.

To record data, the HDC 6 sends record data WD (information sequence) received from a host system (for example, a personal computer), to the read/write channel 5, as shown in FIG. 1. In the read/write channel 5, the turbo encoder 20 executes a turbo coding process to output the resulting data to the write amplifier 41 via the write signal processing circuit 51.

In the turbo encoder 20, the RSC encoder 202 executes an RSC coding process on an RLL code sequence of the recorded data sequence WD. In this case, the RSC encoder 202 is composed of a one-bit delay element (D) and a mod 2 adder (exclusive logical OR gate (+)) as shown in, for example, FIG. 3.

FIG. 3 shows a specific example of the RSC encoder 202 having a restricted length of 3. In this case, the RLL code sequence is expressed as an input information sequence ($U_k$). Further, a parity sequence (Pk) generated by the RSC encoder 202 can be expressed by an internal sequence (Zk).

In this case, the characteristics of the RSC encoder 202 can be expressed by Equation (1) using a one-bit delay operator D.

$$G(D) = \left[ 1 \quad \frac{1+D^2}{1+D+D^2} \right]_{\mathrm{mod}\, 2} \quad (1)$$

That is, with the RSC encoder 202 having such characteristics, when an input error sequence has a Hamming weight of 2 and is divisible by a generation polynomial "$1+D+D^2$", i.e. if the input error sequence is expressed by "$1+D^{3j}$ (i is a natural number)", an output error parity sequence is finite. This polynomial is defined as a dominant error event.

Then, the PUMUX 203 executes a process of decimating the parity sequence according to a predetermined coding rate (puncture rate), while inserting the decimated bits into the information sequence, and then outputs the resultant information sequence as a systematic code sequence. In this case, if, for example, the coding rate is assumed to be 33/34, the PUMUX 203 adds an arbitrary one bit from the parity sequence to the information sequence every 33 bits as shown in FIG. 4. In this case, if the n-th parity from the leading one is left, the point in time k at which the parity bit is left is expressed by Equation (2).

$$k=33j+n (j=\text{integer}) \quad (2)$$

In short, in terms of a general relationship, the point in time k at which the parity bit is left is expressed by k=mj+d where d is a constant and j is an integer equal to or larger than zero.

The precoder 204 executes a predetermined inverse conversion process on the systematic code sequence from the PUMUX 203 and then sends the processed systematic code sequence to the write signal processing circuit 51. The write signal processing circuit 51 executes a recording compensation process on the systematic code sequence to dispatch the resultant systematic code sequence to the write amplifier 41. Accordingly, the write head records a turbo coded recorded data signal on the disk 1 on the basis of a write current supplied by the write amplifier 41.

Then, when read from the disk 1 by the read head, the reproduced data signal (DS) is amplified by the read amplifier 40 and then transmitted to the read/write channel 5. The reproduced data signal is transmitted to the turbo decoder 21 through a series of signal processing systems in the read channel.

In the turbo decoder 21, the APP decoder 210 decodes the inner code in the PR channel to output external information on the inner code. The external information on the inner code is transmitted to the APP decoder 213 through the DE-PUMUX 211 and the interleaver 212. The APP decoder 213 executes an APP decoding process on the RSC sequence (outer code).

The APP decoder 213 can correct the polynomial "$1+D^{3i}$", previously defined as a dominant error event, if it meets a certain relationship with the point in time at which the parity bit is left. That is, if an RSC code is subjected to APP decoding. For example, the polynomial "$1+D^{36}$", an error event, can be corrected at the points of time shown by the circles in FIG. 5 (here, the time zero indicates the point in time at which the parity bit is left). Further, the points of time at which the error event cannot be corrected can be collectively expressed as "3m".

Accordingly, to allow the error event to be corrected even at the points of time at which the error event otherwise cannot be corrected, the point in time at which the parity bit is left may be shifted from 3m. Specifically, the predetermined coding rate (puncture rate) in the PUMUX 203 may be set at, for example, 34/35.

Figures 6, 7:
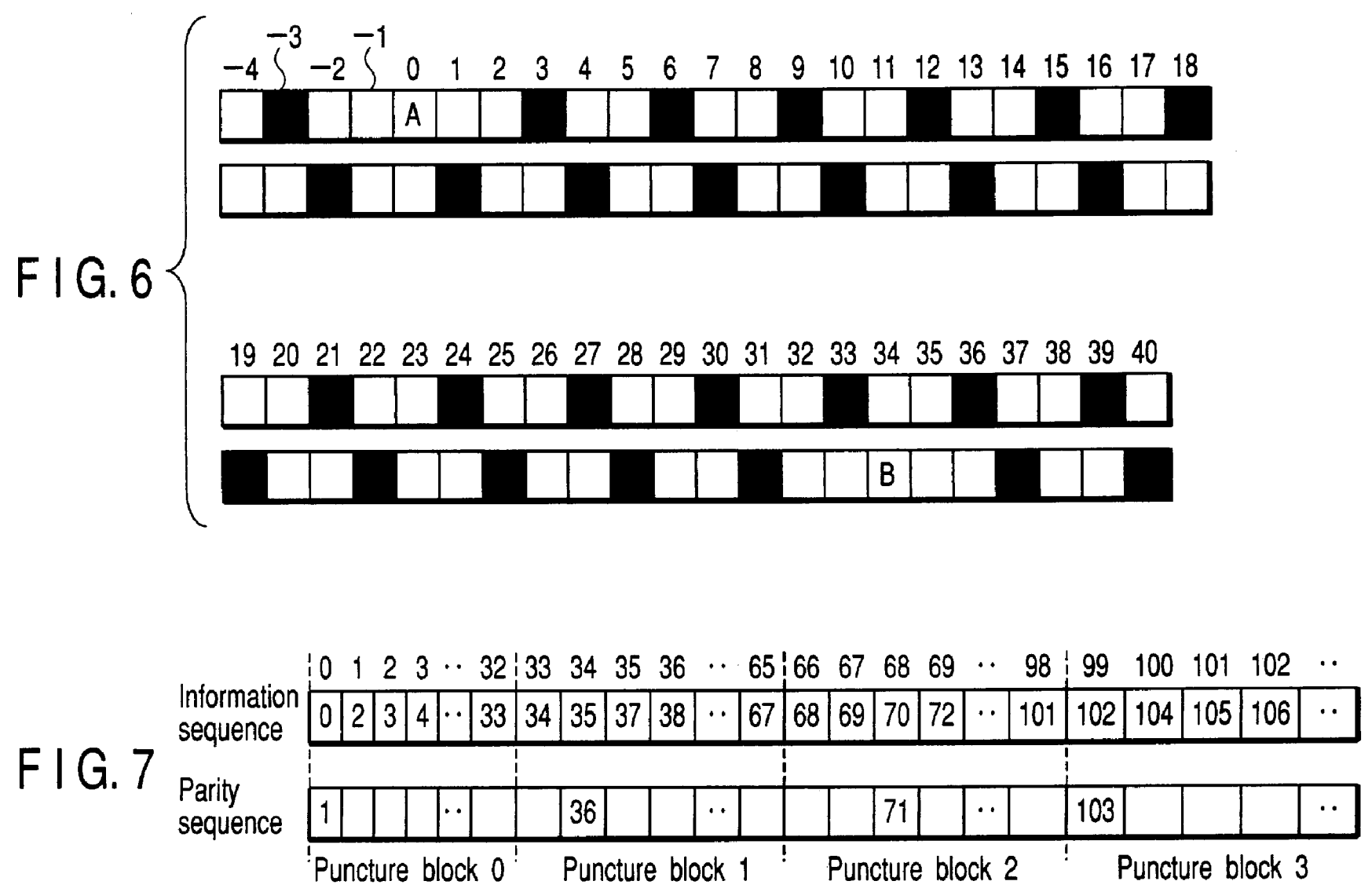

FIG. 6 shows the points of time at which errors can be corrected at a puncture rate of 34/35. That is, FIG. 6 indicates that a parity bit A enables errors to be corrected at the points of time in the upper stage, while a parity bit B enables errors to be corrected at the points of time in the lower stage. Consequently, either parity bit enables correction at any point of time.

In short, for the RSC sequence of the polynomial "$1+D^{ci}$" (c is a constant, and i is a natural number)", a dominant error event, the predetermined coding rate (puncture rate) in the PUMUX 203 may be set according to the general relation "m/(m+1)". In this case, m=cn−b, n is a natural number, and b=(1, 2, . . . , c−1).

Then, in a variation of this embodiment, if the predetermined coding rate (puncture rate) in the PUMUX 203 is set at, for example, 33/34, the parity to be left is varied for each puncture block. Specifically, as shown in FIG. 7, error correction is prevented from being disabled by setting the point in time at which the parity is left, as shown in Equation 3.

$$k=33j+n+(j\ mod 3) \quad (3)$$

In short, the point in time k at which the parity bit is left can be expressed by "k=mj+d+(jmodc) where d is a constant and j is an integer equal to or larger than zero.

As described above, according to this embodiment, in the turbo encoder 20, when the PUMUX 203 decimates a parity sequence of an RSC sequence output by the RSC encoder 202, the decimation is carried out at a coding rate (puncture rate) set in view of a dominant error event, e.g. 33/34. This improves the error correction capability of the turbo decoder 21 when a turbo decoded sequence is determined by an iterative decoding process executed on the RSC sequence (outer code) and including an APP decoding process. Consequently, in the read/write channel 5, to which a concatenated turbo coding/decoding method is applied, a good error rate characteristic (bit error characteristic) for a data decoding process is obtained.

As described above in detail, according to this embodiment, the error correction capability for data reproduction is improved to provide a good error rate characteristic, particularly in a disk drive using a read/write channel to which a serial concatenated turbo coding/iterative decoding method is applied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A disk drive, comprising:
a head to read and write data from and to a disk medium; and
a read/write channel that operates as a signal processing unit and processes a record data signal or a reproduction data signal transmitted to or from the head, the read/write channel having a concatenated turbo codec,
wherein the concatenated turbo codec includes an RSC encoder which encodes a record data sequence into a recursive systematic convolutional code sequence for data recording and a puncture unit which executes a decimation process on the recursive systematic convolutional code sequence at such a decimation rate that a predetermined error rate is ensured in a decoding system, the puncture unit is configured to delete parity bits from the recursive systematic convolutional code sequence in order to achieve a predetermined coding rate which is given by a general relation "m/(m+1)" where m=cn−b, c is a constant in accordance with a dominant error event of the recursive systematic convolutional code sequence, n is a natural number, and b=(1, 2, . . . , c−1), and parity bits to be left in the recursive systematic convolutional code sequence are determined according to a point in time k which is give by "k=mj+d" where d is a constant and j is an integer equal to or larger than zero.

2. A disk drive, comprising:
a head to read and write data from and to a disk medium; and
a read/write channel that operates as a signal processing unit and processes a record data signal or a reproduction data signal transmitted to or from the head, the read/write channel having a concatenated turbo codec,
wherein the concatenated turbo codec includes an RSC encoder which encodes a record data sequence into a recursive systematic convolutional code sequence for data recording and a puncture unit which executes a decimation process on the recursive systematic convolutional code sequence at such a decimation rate that a predetermined error rate is ensured in a decoding system, the puncture unit is configured to delete parity bits from the recursive systematic convolutional code sequence in order to achieve a predetermined coding rate which is given by a general relation "m/(m+1)" where m=cn−b, c is a constant in accordance with a dominant error event of the recursive systematic convolutional code sequence, n is a natural number, and b=(1, 2, . . . , c−1), and parity bits to be left in the recursive systematic convolutional code sequence are determined according to a point in time k which is give by "k=mj+d+(jmodc)" where d is a constant and j is an integer equal to or larger than zero.

3. A method of data recording and reproducing in a disk drive which records and reproduces data on and from a disk medium, the method using a concatenated turbo coding/decoding, and the method comprising:

coding a record data sequence into a recursive systematic convolutional code sequence on the basis of a turbo coding method when data is written to said disk medium; and carrying out puncture on the recursive systematic convolutional code sequence at such a decimation rate that a predetermined error rate is ensured in a decoding system, wherein at the executing of the puncture, parity bits are deleted from the recursive convolutional code sequence in order to achieve a predetermined coding rate which is given by a general relation "m/(m+1)" where m=cn−b, c is a constant in accordance with a dominant error event of the recursive systematic convolutional code sequence, n is a natural number, and b=(1, 2, . . . , c−1), and parity bits to be left in the recursive systematic convolutional code sequence are determined according to a point in time k which is given by "k=mj+d" where d is a constant and j is an integer equal to or larger than zero.

4. A method of data recording and reproducing in a disk drive which records and reproduces data on and from a disk medium, the method using a concatenated turbo coding/decoding, and the method comprising:

coding a record data sequence into a recursive systematic convolutional code sequence on the basis of a turbo coding method when data is written to said disk medium; and carrying out puncture on the recursive systematic convolutional code sequence at such a decimation rate that a predetermined error rate is ensured in a decoding system, wherein at the executing of the puncture, parity bits are deleted from the recursive convolutional code sequence in order to achieve a predetermined coding rate which is given by a general relation "m/(m+1)" where m=cn−b, c is a constant in accordance with a dominant error event of the recursive systematic convolutional code sequence n is a natural number, and b=(1, 2, . . . , c−1), and parity bits to be left in the recursive systematic convolutional code sequence are determined according to a point in time k which is given by "k=mj+d+(jmodc)" where d is a constant and j is an integer equal to or larger than zero.

* * * * *